(12) United States Patent
Lin et al.

(10) Patent No.: US 11,041,969 B2
(45) Date of Patent: Jun. 22, 2021

(54) METHODS AND SYSTEMS FOR MODELING SUBSURFACES CONTAINING PARTIAL FAULTS

(71) Applicants: Baojiu Lin, Houston, TX (US); Hao Huang, The Woodlands, TX (US)

(72) Inventors: Baojiu Lin, Houston, TX (US); Hao Huang, The Woodlands, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 181 days.

(21) Appl. No.: 16/389,041

(22) Filed: Apr. 19, 2019

(65) Prior Publication Data
US 2019/0391288 A1 Dec. 26, 2019

Related U.S. Application Data

(60) Provisional application No. 62/688,553, filed on Jun. 22, 2018, provisional application No. 62/752,624,
(Continued)

(51) Int. Cl.
*G01V 1/30* (2006.01)
*G01V 1/28* (2006.01)
(Continued)

(52) U.S. Cl.
CPC .............. *G01V 1/302* (2013.01); *G01V 1/282* (2013.01); *G01V 1/345* (2013.01); *G01V 99/005* (2013.01);
(Continued)

(58) Field of Classification Search
CPC ...... G01V 1/302; G01V 99/005; G01V 1/282; G01V 1/345; G01V 2210/642;
(Continued)

(56) References Cited

U.S. PATENT DOCUMENTS 9,035,570 B2   5/2015   Schmitz et al.
9,395,466 B1   7/2016   Mallet et al.
(Continued)

FOREIGN PATENT DOCUMENTS

WO    WO 2017/076958 A1   5/2017

OTHER PUBLICATIONS

U.S. Appl. No. 62/688,553, filed Jun. 22, 2018, Lin et al.
(Continued)

*Primary Examiner* — Mischita L Henson
(74) *Attorney, Agent, or Firm* — ExxonMobil Upstream Research Company, Law Department

(57) ABSTRACT

Disclosed herein are geologic modeling methods and systems employing function-based representations of horizons intersected by partial faults. An illustrative method embodiment includes: (a) obtaining a seismic image volume; (b) identifying a horizon within the seismic image volume, said horizon being intersected by a partial fault; (c) deriving a function-based representation of the horizon, the representation being continuous except across the partial fault; (e) constructing a watertight subsurface model using the function-based representation; (f) assigning petrophysical parameter values to compartments of the watertight subsurface model; and, optionally, (g) storing or displaying the watertight subsurface model.

16 Claims, 6 Drawing Sheets

Related U.S. Application Data filed on Oct. 30, 2018, provisional application No. 62/752,637, filed on Oct. 30, 2018.

(51) Int. Cl.
| | |
|---|---|
| *G01V 1/34* | (2006.01) |
| *G06F 30/20* | (2020.01) |
| *G01V 99/00* | (2009.01) |
| *G06T 17/05* | (2011.01) |
| *G06T 17/20* | (2006.01) |

(52) U.S. Cl.
CPC .............. *G06F 30/20* (2020.01); *G06T 17/05* (2013.01); *G06T 17/20* (2013.01); *G01V 2210/642* (2013.01); *G01V 2210/643* (2013.01)

(58) Field of Classification Search
CPC ....... G01V 2210/643; G01V 2210/644; G01V 2210/66; G06F 30/20; G06T 17/05; G06T 17/20
USPC ........................................................ 703/9–10
See application file for complete search history.

(56) References Cited

U.S. PATENT DOCUMENTS

| | | | |
|---|---|---|---|
| 9,536,022 B1 | 1/2017 | Tertois et al. | |
| 9,652,889 B2 | 5/2017 | Young et al. | |
| 10,107,938 B2 | 10/2018 | Huang et al. | |
| 2011/0054857 A1* | 3/2011 | Moguchaya | G01V 99/00 703/2 |
| 2011/0063292 A1* | 3/2011 | Holl | G01V 11/00 345/420 |
| 2011/0115787 A1 | 5/2011 | Kadlec | |
| 2012/0209526 A1 | 8/2012 | Imhof | |
| 2012/0265510 A1 | 10/2012 | Lepage | |
| 2013/0226545 A1* | 8/2013 | Bo | G01V 1/301 703/6 |
| 2013/0246031 A1 | 9/2013 | Wu et al. | |
| 2015/0316683 A1 | 11/2015 | Purves et al. | |
| 2016/0090825 A1* | 3/2016 | Imhof | E21B 43/00 703/10 |
| 2018/0031719 A1 | 2/2018 | Huang et al. | |
| 2018/0348401 A1 | 12/2018 | Imhof et al. | |

OTHER PUBLICATIONS

U.S. Appl. No. 62/752,624, filed Oct. 30, 2018, Huang.
U.S. Appl. No. 62/752,637, filed Oct. 30, 2018, Huang.
Branets, et al. (2015) "Capturing Geologic Complexity in a Simulation Grid", SPE-173270-MS, SPE Reservation Simulation Symposium, Houston, Feb. 2015.
Natali, M. et al. (2012) "Rapid Visualization of Geological Concepts", 2012 25$^{th}$ SIBGRAPI Conference on Graphics, Patterns and Images, Aug. 22-25, 2012, pp-150-157.
Natali, M. et al. (2013) "Modeling Terrains and Subsurface Geology" in EuroGraphics 2013 State of the Art Reports (STARs), 2013, pp. 155-173.
Duan, P. et al. (2014) "DEM Reconstruction Based on Adaptive Local RBF", in the Open Civil Engineering Journal, Jul. 31, 2014, vol. 8, pp. 232-236.
Nguyen et al. (2014) "A Complete Method for Reconstructing an Elevation Surface of 3D Point Clouds", in REV Journal on Electronics and Communications, vol. 4, No. 3-4, Jul.-Dec. 2014, pp. 91-97.
Mallet et al. (2010) "SPE 134978 Solid Earth Modeling and Geometric Uncertainties", Sep. 22, 2010, XP055309781, 7pgs.

\* cited by examiner

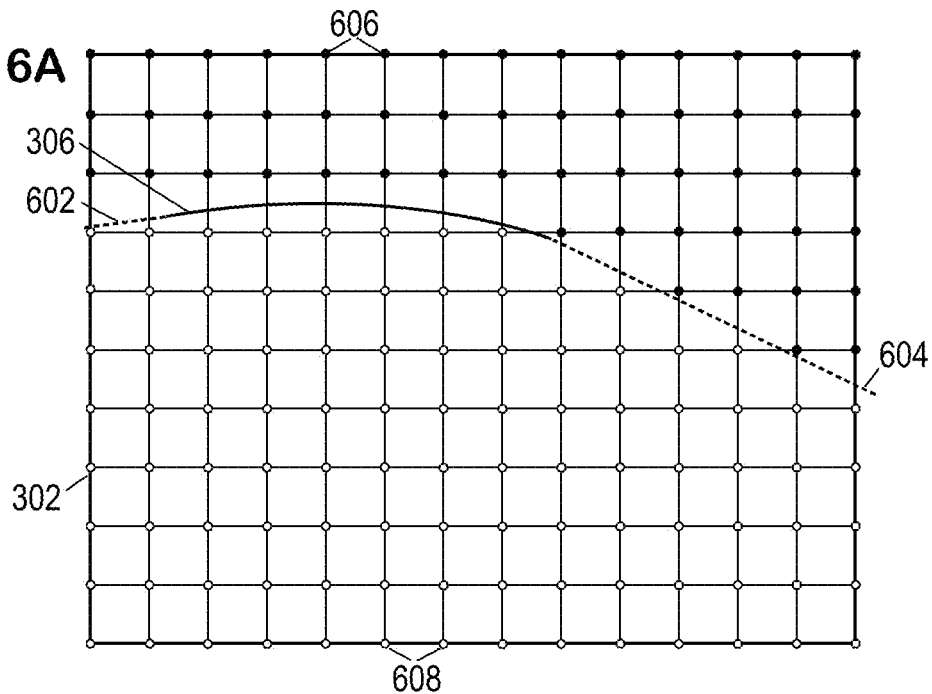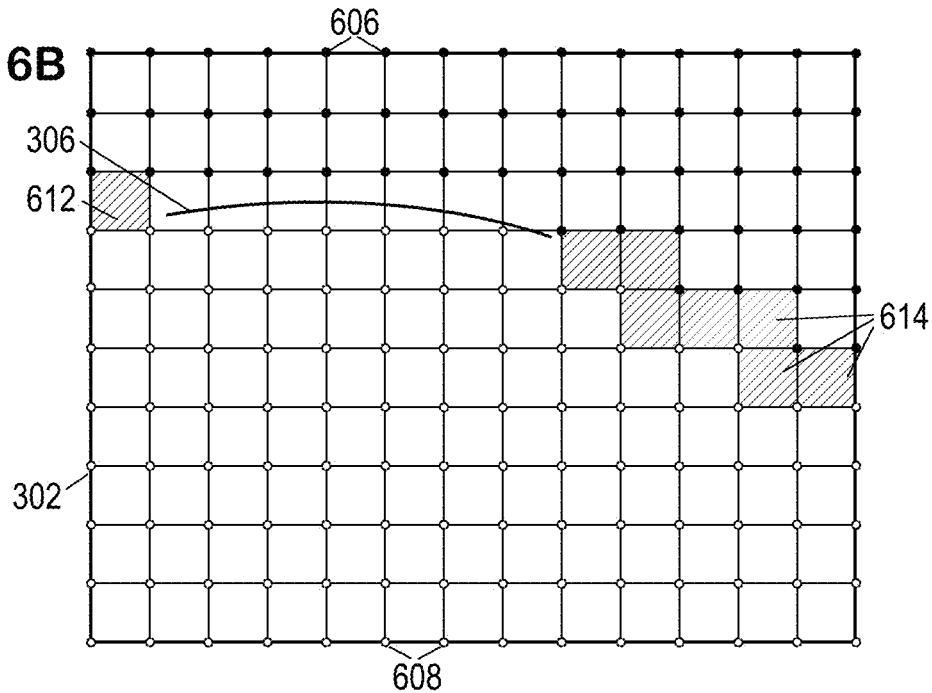

METHODS AND SYSTEMS FOR MODELING SUBSURFACES CONTAINING PARTIAL FAULTS

CROSS-REFERENCE TO RELATED APPLICATIONS

This application claims the benefit of (i) U.S. Provisional Application No. 62/688,553 entitled "Methods and Systems for Modeling Subsurfaces Containing Partial Faults" that was filed Jun. 22, 2018; (ii) U.S. Provisional Application No. 62/752,624 entitled "Method and System for Generating Simulation Grids by Mapping a Grid from the Design Space" that was filed Oct. 30, 2018; and (iii) U.S. Provisional Application No. 62/752,637 entitled "Methods and Systems for Simulation Gridding with Partial Faults" that was filed on Oct. 30, 2018; the disclosures of which are incorporated herein by reference.

TECHNICAL FIELD

The present application relates generally to the field of geologic modeling and, in particular, to methods and systems for constructing a subsurface model having surfaces intersected by partial faults. The subsurface model may be used for hydrocarbon operations such as hydrocarbon exploration, development, and/or production operations.

BACKGROUND

A geologic model (or subsurface model) is a computer-based three-dimensional representation of a region beneath the earth's surface. Such models can be used to model a petroleum reservoir, a depositional basin, or other regions which may have valuable mineral resources. Once the model is constructed, it can be used for various purposes, many of which are intended to facilitate efficient and economical recovery of the valuable resources. For example, the geologic model may be used as an input to petroleum reservoir simulations, which are used to plan well placements and predict hydrocarbon production from a petroleum reservoir over time.

Geologic models must often be derived from seismic survey measurements, aided by reference to well logs. However, the relationships between field recorded seismic data and the underlying subsurface architecture are complex and ambiguous. These complexities create difficulties when one seeks to create an accurate geologic model using realistic geometries, features, and architecture. Modelers often employ feature identification and "extraction", i.e., conversion of the identified features into three-dimensional representations. Though the subsurface structures can generally be well represented by surfaces that intersect without voids or gaps to form enclosed volumes or geobodies, i.e., by forming a "watertight model", it is often difficult for manual interpreters and automated feature extractors to construct models having this desirable feature. Consequently, various attempts have been made to provide systems and methods to derive a watertight model from surfaces representing horizons and faults. For example, U.S. Patent Application Publication No. 2018/0031719 describes systems and methods to facilitate adjustment of horizon and fault locations within a model by using surface representations (such as level set functions) which can be readily extended to intersect other surfaces in the model.

While U.S. Patent Application Publication No. 2018/0031719 discusses modeling of partial faults (i.e., faults that do not entirely divide a horizon into two separate pieces), it fails to disclose a suitable representation for the horizon(s) containing the partial fault. A naïve approach might be to extend the partial fault so as to fully divide the horizon into two separate horizons, each of which can be separately represented. However, this approach unnecessarily fragments the horizon and undesirably permits the development of a discontinuity between the separate pieces of the horizon. Therefore, there remains a need for methods and systems for constructing subsurface models that contain partial faults.

SUMMARY

Disclosed herein geologic modeling methods and systems employing function-based representations of horizons intersected by partial faults. An illustrative method embodiment includes: (a) obtaining a seismic image volume; (b) identifying a horizon within the seismic image volume, said horizon being intersected by a partial fault; (c) deriving a function-based representation of the horizon, the representation being continuous except across the partial fault; (e) constructing a watertight subsurface model using the function-based representation; (f) assigning petrophysical parameter values to compartments of the watertight subsurface model; and (g) storing the watertight subsurface model.

One illustrative subsurface modeling system embodiment includes: a memory having subsurface modeling software; and one or more processors coupled to the memory to execute the subsurface modeling software. The software causes one or more processors to implement the foregoing method.

The software can also be illustratively embodied as a computer readable program in a non-transitory information storage product, to implement the foregoing system and method embodiments when suitably executed.

Each of the foregoing embodiments may be employed together with one or more of the following optional features in any suitable combination. For example, the foregoing embodiments may further comprise using the stored subsurface model to provide an interactive visualization of subsurface structures in a region corresponding to the seismic image volume; simulating movement of reservoir fluids in said region; and providing an evaluation of one or more reservoir production strategies including well placements.

In one or more embodiments, deriving the function-based representation of the horizon may comprise employing a radial basis function method in which a weighted sum of radial basis functions is obtained having a linear least squares fit to nodes on the horizon, subject to elimination of direct interaction between nodes on opposite sides of the partial fault. The elimination may comprise adjusting matrix entries in a linear least squares equation to solve for weight coefficients, said adjusting producing an effect of a substantially increased distance value between nodes on opposite sides of the partial fault. In some embodiments, the elimination may comprise zeroing the radial basis function contributions between nodes on opposite sides of the partial fault in a matrix equation.

In one or more embodiments, deriving the function-based representation of the horizon may comprise employing mesh vertices on or around the horizon having associated signed distance values to the horizon, said mesh vertices including a set of mesh vertices that define mesh cells traversed by the partial fault, the set of mesh vertices further having extrapolated distance values that are extrapolated across the partial fault from associated distance values for vertices on an opposite side of the partial fault, and wherein said deriving applies a level set function method in which interpolation is performed from said associated and extrapolated distance values. The associated and extrapolated distance values may be signed, wherein the sign is based on which side of the horizon their vertices are on. In some embodiments, constructing the watertight subsurface model may comprise closing any horizon mismatch that extends beyond the partial fault.

In one or more embodiments, deriving the function-based representation of the horizon may comprise creating one or more extensions of the partial fault to divide the horizon into two separate pieces; determining for each of multiple mesh vertices on or around the horizon an associated distance value to the horizon; and applying a level set function method to fit a first function to a first of the two separate pieces, a second function to a second of the two separate pieces, and a merge function to a set of mesh vertices that define mesh cells traversed by said one or more extensions.

BRIEF DESCRIPTION OF THE DRAWINGS

The advantages of the present invention may be better understood by referring to the following detailed description and the attached drawings.

FIGS. 6A and 6B are plan views of a split horizon including LSF nodes for representing the surface.

NOMENCLATURE

Figure 1A:
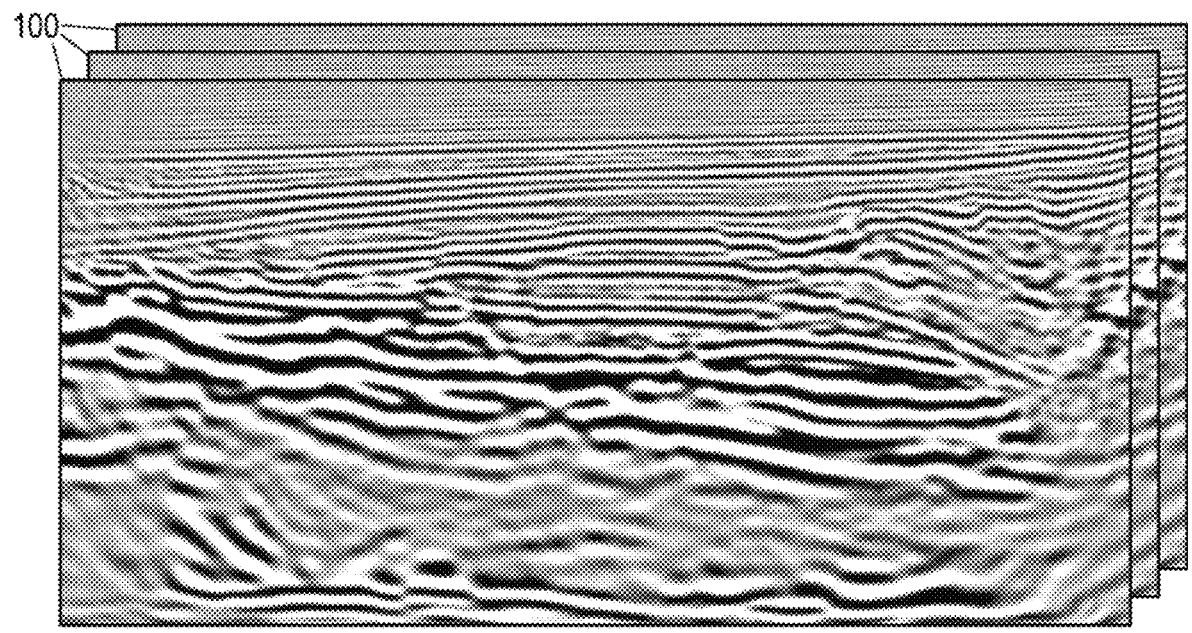
FIG. 1A shows an illustrative measured seismic image volume.

Various terms as used herein are defined herein. To the extent a term used in a claim is not defined herein, it should be given the broadest definition persons in the pertinent art have given that term as reflected in at least one printed publication or issued patent.

As used herein, the term "hydrocarbons" are generally defined as molecules formed primarily of carbon and hydrogen atoms. Hydrocarbons may also include other elements or compounds, such as, but not limited to, halogens, metallic elements, nitrogen, oxygen, sulfur, hydrogen sulfide (H2S), and carbon dioxide (CO2). Hydrocarbons may be located within or adjacent to mineral matrices within the earth (i.e., reservoirs) such as sedimentary rock, sands, silicilytes, carbonates, diatomites, and other porous media. Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof.

As used herein, "hydrocarbon exploration" refers to any activity associated with determining the location of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models, and determining the likely locations for hydrocarbon reservoirs within the subsurface. The measurement data may include seismic data, gravity data, magnetic data, electromagnetic data, and the like.

As used herein, "hydrocarbon development" refers to any activity associated with planning of extraction and/or access to hydrocarbons in subsurface regions. Hydrocarbon development normally refers to any activity conducted to plan for access to and/or for production of hydrocarbons from the subsurface formation and the associated modeling of data to identify preferred development approaches and methods. By way of example, hydrocarbon development may include modeling of the subsurface formation and extraction planning for periods of production; determining and planning equipment to be utilized and techniques to be utilized in extracting the hydrocarbons from the subsurface formation; and the like.

As used herein, "hydrocarbon operations" refers to any activity associated with hydrocarbon exploration, hydrocarbon development and/or hydrocarbon production.

As used herein, "hydrocarbon production" refers to any activity associated with extracting hydrocarbons from subsurface location, such as a well or other opening. Hydrocarbon production normally refers to any activity conducted to form the wellbore along with any activity in or on the well after the well is completed. Accordingly, hydrocarbon production or extraction includes not only primary hydrocarbon extraction, but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

As used herein, "subsurface model" refers to a reservoir model, geomechanical model, watertight model, and/or a geologic model. The subsurface model may include subsurface data distributed within the model in two-dimensions (e.g., distributed into a plurality of cells, such as elements or blocks), three-dimensions (e.g., distributed into a plurality of voxels), or four or more dimensions.

As used herein, "watertight" means that a specific volume can be divided into one or more volume compartments with boundaries that have no holes and no overlaps with other boundaries. A watertight framework of faults and horizons divides a containing specified volume of interest into one or more volume compartments that have boundaries completely enclosing the compartments. Each fault and horizon is either a boundary of or contained within a volume compartment without any piece outside of a compartment.

As used herein, "surface" refers to geologic features, such as horizons and faults, as well as technical features, such as model boundary, concession boundary, or artificial compartment boundary. A horizon separates two packages of rock. A fault is a discontinuity of rock packages. Often, a fault exhibits displacement. An artificial compartment boundary may be used for accounting purposes.

As used herein, "watertight model" is a model (e.g., three-dimensional model) of the subsurface region having a mesh representing various objects (e.g., faults and/or horizons) and forming one or more compartments that are watertight.

As used herein, "geologic model" is a model (e.g., three-dimensional model) of the subsurface region having static properties and includes objects, such as faults and/or horizons, and properties, such as facies, lithology, porosity, permeability, or the proportion of sand and shale.

As used herein, "reservoir model" is a model (e.g., three-dimensional model) of the subsurface that in addition to static properties, such as porosity and permeability, also has dynamic properties that vary over the timescale of resource extraction, such as fluid composition, pressure, and relative permeability.

As used herein, "geomechanical model" is a model (e.g., three-dimensional model) of the subsurface that contain static properties, such as rock compressibility and Poisson's ratio, and model the mechanical response (e.g. compaction, subsidence, surface heaving, faulting, and seismic event) of the rock to fluid injection and extraction.

As used herein, "structural framework" or "framework" refer to a subsurface representation formed from objects (e.g., faults, horizons, other surfaces and model boundaries). For example, the framework is a subsurface representation that contains surfaces and polylines. A framework may be formed by surfaces of geologic, engineering, planning or other technical relevance.

As used herein, "concept" or "scenario" is a configuration of the framework with a given set of inputs parameters (e.g., order of objects). Some or all of the inputs may be moved, deformed, or intersected in a different order to form a different scenario.

As used herein, "zone", "region", "container", or "compartment" is a defined space, area or volume contained in the framework or model, which may be bounded by one or more objects. The volume may include similar properties.

As used herein, "mesh" or "grid" is a representation of a region of space (e.g., 2-D domain or 3-D domain), which may include objects, and includes two or more nodes and a set of polygons or polyhedra disposed within the region (e.g., a volumetric representation). The mesh may represent each object by a set of polygons or polyhedra disposed within the region. Properties may be assigned to some or all polygons.

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve performing by execution of a reservoir-simulator computer program on a processor, which computes composition, pressure, or movement of fluid as function of time and space for a specified scenario of injection and production wells by solving a set of reservoir fluid flow equations. A geomechanical simulation may involve performing by execution of a geomechanical simulator computer program on a processor, which computes displacement, strain, stress, shear slip, energy release of the rock as a function of time and space in response to fluid extraction and injection.

DETAILED DESCRIPTION

In the following detailed description, various specific embodiments of the present disclosure are described in connection with preferred embodiments. However, to the extent that the following description is specific to a particular embodiment or a particular use of the present disclosure, this is intended to be for exemplary purposes only and to simply provide a description of the exemplary embodiments. Accordingly, the disclosure is not limited to the specific embodiments described below, but rather, it includes all alternatives modifications, and equivalents falling within the true spirit and scope of the appended claims.

Turning now to the figures. FIG. 1A shows an illustrative measured seismic image volume 100, which can be expressed in many ways but is here shown as parallel slices of a three-dimensional volume. The measured image volume 100 is typically obtained by processing of field-recorded seismic survey traces representing seismic wave responses to shots or other sources of seismic energy triggered at an array of shot locations. The processing corrects for seismic wave travel times to determine reflective interface locations, and combines repeated measurements at each location to increase the signal to noise ratio. While seismic reflectivity is commonly employed, other seismic wave properties can also or alternatively be derived from the traces and used to construct the measured seismic image volume. One particular transformation is the inversion of the seismic data to estimate petrophysical parameters such as porosity, clay volume fraction, etc. that are often part the geological model.

Figure 1B:
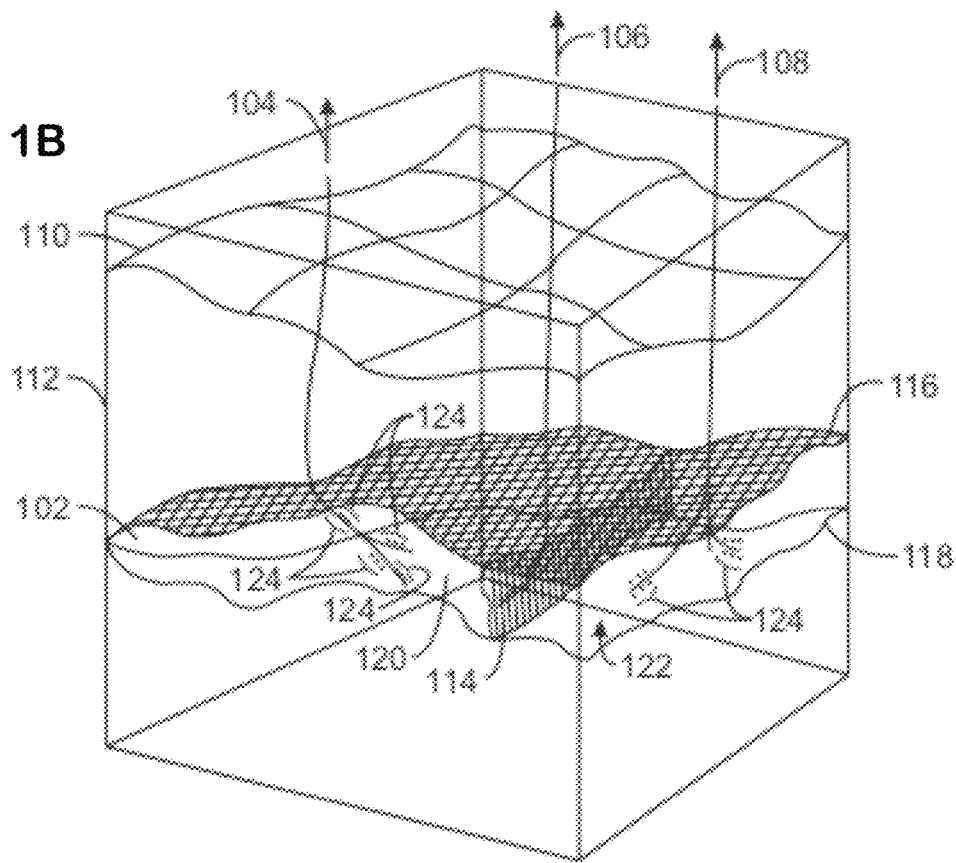
FIG. 1B shows an illustrative "watertight" subsurface model.

FIG. 1B shows an illustrative subsurface model having features that may be derived from a seismic image volume. The illustrative model includes a number of surfaces defining the boundaries of a potentially hydrocarbon-bearing formation 102 that may serve as a reservoir of oil or natural gas. The model facilitates placement and drilling of wells 104, 106, 108, from the Earth's surface 110 through layers of overburden 112 to access the formation 102. The illustrative model surfaces may include faults 114 and horizons 116, 118. The surfaces may intersect in a fashion that divides the reservoir formation 102 into distinct compartments 120, 122. The petrophysical parameters of each compartment may be estimated based on the seismic image data and/or measured using logging instruments in exploratory wells.

Modern drilling techniques enable the wells 104, 106, 108 to deviate from the vertical orientation and to be directionally drilled to follow the reservoir 102. Further, the wells can be branched to increase the amount of wellbore contact with the reservoir, as shown for wells 104 and 108. The wells 104, 106, and 108, can have numerous areas with perforations 124, indicated as dots next to the wells, to provide a flow path for fluids, such as hydrocarbons, from the reservoir 102 into the wells 104, 106, and 108 for removal to the surface. If properly employed, such techniques may enable faster and more efficient extraction of reservoir fluids.

The locations and paths for the wells 104, 106, and 108, and the location of the perforations 124, may be optimized by simulations performed using the subsurface model. Subsurface models are often used as inputs to reservoir simulation programs that predict the behavior of fluids contained therein and may also predict the behavior of rocks under various scenarios of hydrocarbon recovery. Miscalculations or mistakes can be costly. For example, miscalculations may result in suboptimal locations for the wells 104, 106, and 108, potentially lacking any contact with the reservoir formation. The additional expense associated with correcting or compensating for the suboptimal well locations would typically exceed a million dollars. Subsurface model based planning and simulation provide a mechanism to identify which recovery options offer more economic, efficient, and effective development plans for a particular reservoir.

More specifically, subsurface model construction begins with extraction of surfaces from a seismic image volume, including faults, horizons, and defining any additional surfaces such as boundaries for the region of interest. The different surfaces may be adjusted and trimmed to define closed volumes often called zones, compartments, or containers, such as zones 120 and 122. The surfaces may be represented using continuous functions, which facilitate moving or refining the surfaces to, e.g., test alternatives for resolving interpretation ambiguities. This may lead to higher production by modifying the positioning of the wells 104, 106, and 108 or the perforations 124. Each reservoir zone 120, 122 may be "meshed", i.e., partitioned into small cells that are defined on a three-dimensional (3D) grid. The meshing process may begin with the surfaces, such as the fault 114 and the horizons 116 and 118, which each can be tessellated into mesh representations. The surface meshes may be extended to form the 3D grid within each zone. The meshing process is followed by assignment of petrophysical parameter values to each cell and/or cell surface. Illustrative parameter values include transmissibility or flow rates between cells, rock type, porosity, permeability, oil saturation, groundwater saturation, gas saturation, clay content, and cementation. The assignment process may employ spatially-correlated reservoir properties and/or fluid properties, and may rely on wellbore measurements, rock type probability maps, and geostatistical distributions. Geostatistics may be used in subsurface models to interpolate observed data and to superimpose an expected degree of variability. Kriging is an exemplary geostatistic technique, which uses the spatial correlation among data to construct the interpolation via semi-variograms. Repeated interpolations with different variograms, different seeds, different training images, etc., may be performed to assess spatial uncertainties.

Figure 2A:
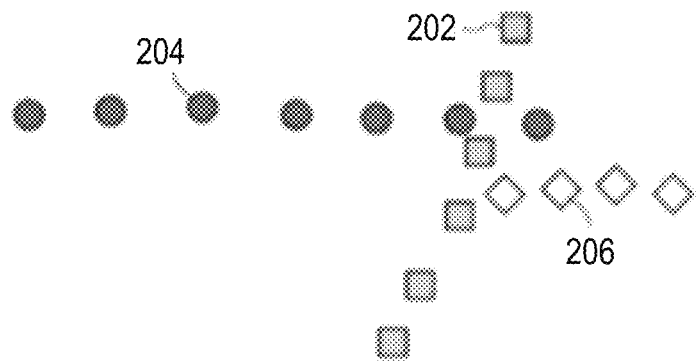
FIG. 2A shows identified features in an illustrative 2D model.
Figure 2B:
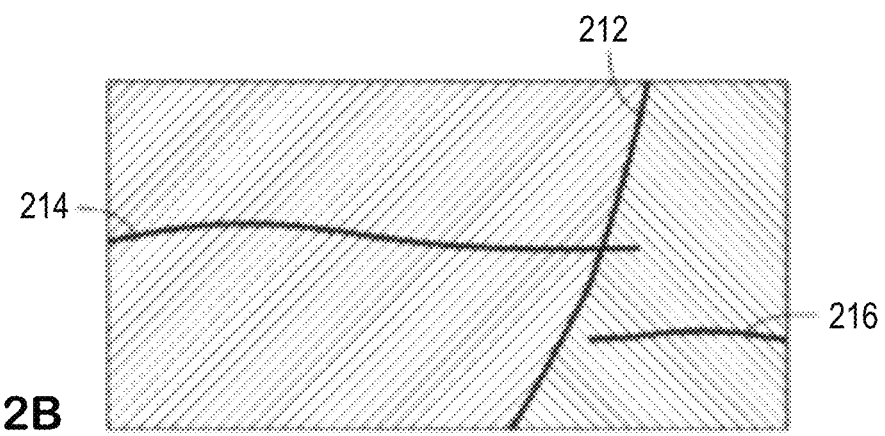
FIG. 2B shows extracted features of the 2D model.
Figure 2C:
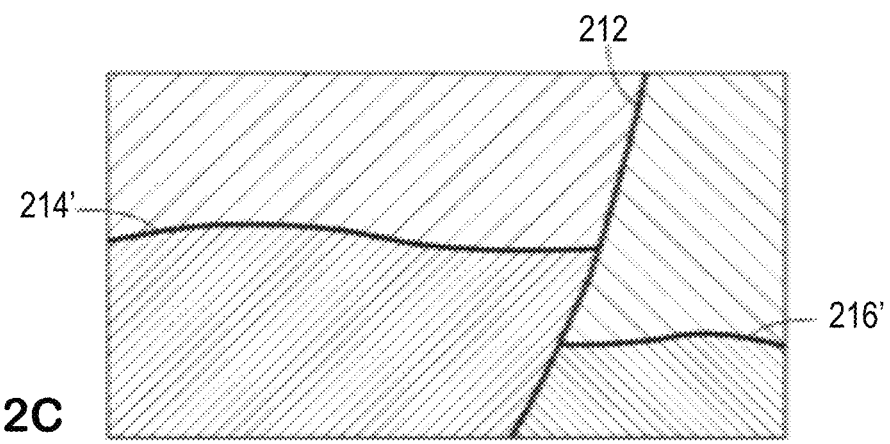
FIG. 2C shows a "watertight" version of the 2D model.

FIG. 2A shows (in two dimensions) an example of identified spatial correlations from a seismic image volume that combine to indicate the presence of three interfaces: a fault 202, a first patch of a horizon 204, and a second patch of the same horizon 206. Based on the identified correlations, FIG. 2B shows estimated positions for the fault surface 212 and the two horizon patches 214 and 216. While geophysics- and geologic-process-based expectations are for horizons to terminate at faults or intersections with other horizons, uncertainties in the feature extraction process may produce results inconsistent with expectations. For example, horizon 214 extends beyond the fault 212, while horizon 216 terminates short of fault 212. FIG. 2C shows how horizon 214' may be trimmed to terminate at fracture 212, while horizon 216' is extended to terminate at fracture 212, thereby forming four closed ("watertight") regions that satisfy the expectations for the physical structure of the subsurface region.

Thus, it is useful to employ surface representations that can be readily trimmed at intersections with other surfaces and/or extrapolated to intersect such other surfaces, as such representations facilitate the formation of watertight models consistent with expectations for physical structures, and further facilitate adjustments of surface locations to accommodate uncertainties in interpretation of the seismic data. Radial basis functions (RBF) and level set functions (LSF) are two such surface representation methods. The RBF representation method fits a weighted sum of basis functions to a set of nodes (a.k.a. points or vertices) on the represented surface, whereas the LSF representation method relies on a set of grid point values to create an implicit function that equals zero at every position on the surface. Though the nodes or grid points may be confined to a given region, the resulting functions can provide extrapolated values outside of that region such that, when an intersecting surface is shifted away, the extrapolated values may be used to fill in the gap. Conversely, the functions can also be trimmed as desired by shifting an intersection surface inward.

For example, given a set of nodes on a horizon, each node i having coordinate values, with x representing a vector of x,y coordinates, one RBF method expresses a horizon as:

$$H(x) = \Sigma w_i f_i(\|x-x_i\|)$$

where $f_i(\|x\|)$ is a radial basis function and $w_i$ are the weights found by solving a system of linear equations. A radial basis function can be any real-valued function whose value depends only on the distance from the origin, so that $f(x)=f(\|x\|)$. The norm is usually Euclidean distance, although other distance functions are also possible. Abbreviating the norm $\|x\|$ as r, suitable radial basis functions include Gaussian functions ($e^{-(\varepsilon r)}$), multi-quadric functions ($\sqrt{1+(\varepsilon r)^2}$), inverse quadratic functions ($1/[1+(\varepsilon r)^2]$), inverse multiquadric ($1/\sqrt{1+(\varepsilon r)^2}$), or polyharmonic functions (for example with $r^k$ for odd k and $r^k \ln(r)$ for even k), among others. Polyharmonic functions include the linear functions (r), cubic functions ($r^3$), quintic functions ($r^5$), and thin plate spline functions ($r^2 \ln(r)$). The parameter $\varepsilon$ is a scaling coefficient that may be selected to be of magnitude inverse to a given distance, which may be the same or in some cases different for each basis function. For example, the scaling parameter for a given basis function may be the inverse of a distance to a nearest neighbor node. As another example, the scaling parameter may be the same for each basis function such as the inverse of the radius of the smallest sphere enclosing all nodes. For computation efficiency, it may be advantageous to use radial basis functions with compact support (i.e., Gaussian, inverse quadratic, inverse multiquadric) that vanish beyond a finite distance from the center, increasing the sparsity of matrices in the calculation of the weight vector and thereby increasing computational speed.

As another example, with x representing a vector of x,y,z coordinates, the LSF method expresses a surface as those points where:

$$F(x)=0$$

Preferably, though not necessarily, F(x) is positive for all points on one side of the surface (e.g., on the outside if the surface encloses a volume) and negative for all points on the other side (e.g., the inside if the surface is closed). Even more preferably, the magnitude of F(x) represents a distance to the surface, e.g., a Euclidean distance. Other suitable distance measures include the absolute-value norm and the Manhattan norm. Given a selected distance measure and sign selections, the distance value is calculated for each node $x_i$ in a set of nodes on or around the horizon. A convenient set of nodes may be the nearby vertices of a regular 3D mesh defined by or for the subsurface model. More specifically, distance values may be determined for the nodes of the mesh cells intersected by the surface.

Thereafter, when it is desired to determine whether a point x is on the surface, the function F(x) may be evaluated with two steps. First, the mesh cell containing x is identified. Second, interpolation is performed using the distance values associated with the nodes of that mesh cell.

In an alternative approach, coefficients may be determined to fit an implicit function to the distance values for the selected nodes. The implicit function can be a plane, a quadratic surface, a high-order polynomial, or some other suitable form having coefficients or other parameters that can be optimized to minimize any mismatch between the function and the calculated distance values. The implicit function can optionally employ 3D radial basis functions:

$$F(x)=\Sigma w_i f_i(\|x-x_i\|)$$

with x representing a vector of x,y,z coordinates, and $w_i$ being the weights found by fitting to the $d_i$ distance values at nodes $x_i$.

Whether obtained using the RBF or LSF methods, the functions representing the surfaces can be readily tessellated to form a mesh over each of the surfaces. In some examples, a volumetric grid, or 3D grid, may then be formed by extending from the mesh at each of the surfaces surrounding a zone to enforce compatibility between the surface mesh and the volumetric grid by sharing points (vertices), edges, and faces. Where signed implicit functions are used as representations, it can be readily determined whether the surface intersects the line segment between any two given points, as a single such intersection would cause the sign of the function to be different at the two points. This characteristic enables root finder techniques (like bisection, the secant method, or regula falsi, among others) to be used for locating the surface. In some examples, an initial grid may be laid over specified zones. Cells may then be bisected or split based on the application of a root finder. When a cell is split, neighboring cells may be updated to preserve compatibility of points, edges, and faces. By iterating over the cells and surfaces, or partitions thereof, the model may then be tessellated to the implicit function representations. The grid evolves from its initial state to one that is aligned with the implicit representations of the surfaces. The initial grid sets a lower limit for the model resolution. In some examples, the initial grid may be formed from tetrahedrons or hexahedrons.

Figure 3A:
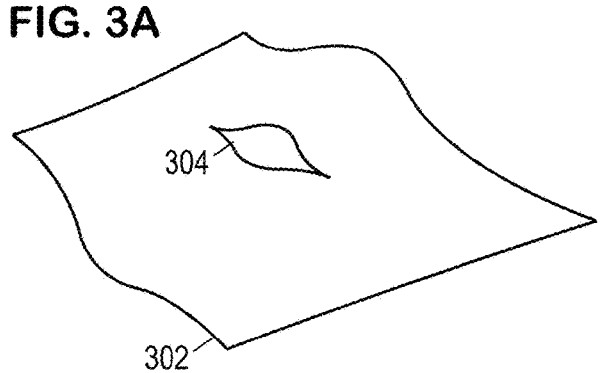
FIGS. 3A and 3B are perspective views of an illustrative horizon having a partial fault.
Figure 3B:
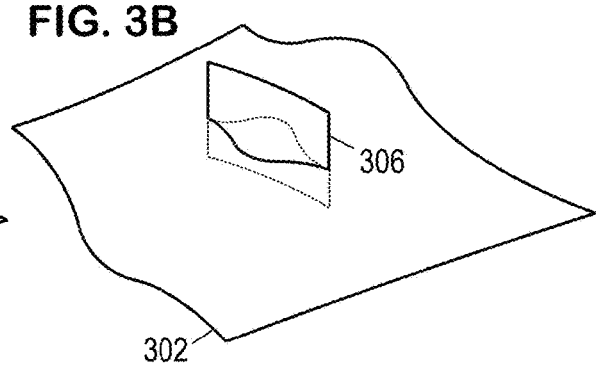

The foregoing surface representations facilitate modeling of continuous surfaces, but may face challenges when applied to surfaces having internal discontinuities. For example, FIGS. 3A and 3B show an illustrative horizon 302 having an internal discontinuity 304 along a partial fault 306. (As used herein, a "partial fault" is a fault that does not entirely divide a horizon into separate pieces.) Described herein below are three approaches to modeling such a partially faulted horizon.

Figure 4:
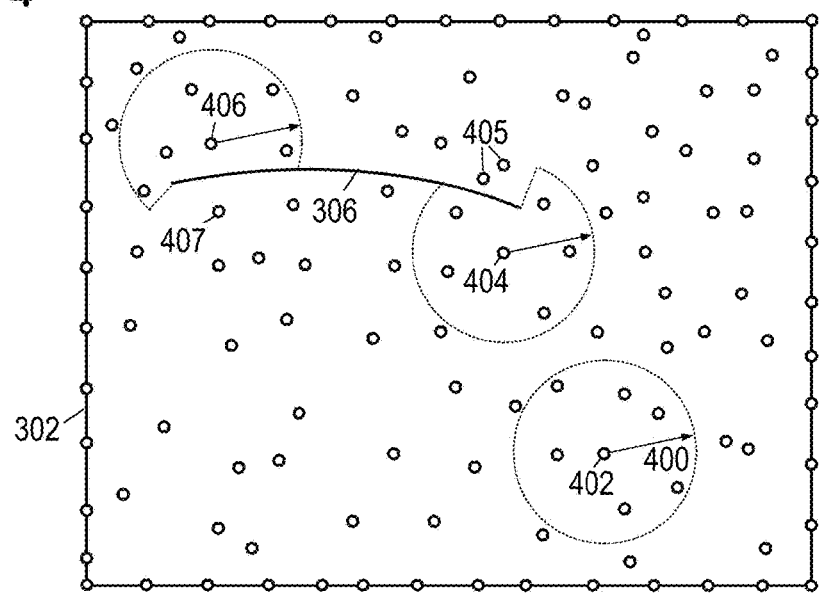
FIG. 4 is a plan view of the illustrative horizon including radial basis function (RBF) nodes for representing the surface.

In the first approach, the RBF method is applied to a given set of nodes on the horizon, but the "distance" between nodes separated by the partial fault is modified to account for the discontinuity. FIG. 4 is a plan view of the illustrative horizon 302 including radial basis function (RBF) nodes for representing the surface. If the support for the radial basis functions is compact, the function becomes negligible outside a given radius 400, making it possible to identify the "neighborhood" of nodes which directly contribute to the weight coefficient of a given node. For node 402, this neighborhood includes all nodes within the given radius 400, as would be the case for the conventional RBF method. However, for nodes near the discontinuity, the nodes on the other side of the discontinuity are excluded from the neighborhood. For example, node 404's neighborhood excludes nodes 405, and node 406's neighborhood excludes node 407. If a line between two nodes intersects the partial fault 306, the distance between those nodes is deemed to be infinite when constructing the matrix equation to solve for the weight coefficients of an RBF representation for the horizon 302. Because nodes on opposite sides of the fault are not "visible to each other", the resulting representation is thus able to support a discontinuity across the fault.

Figure 5A:
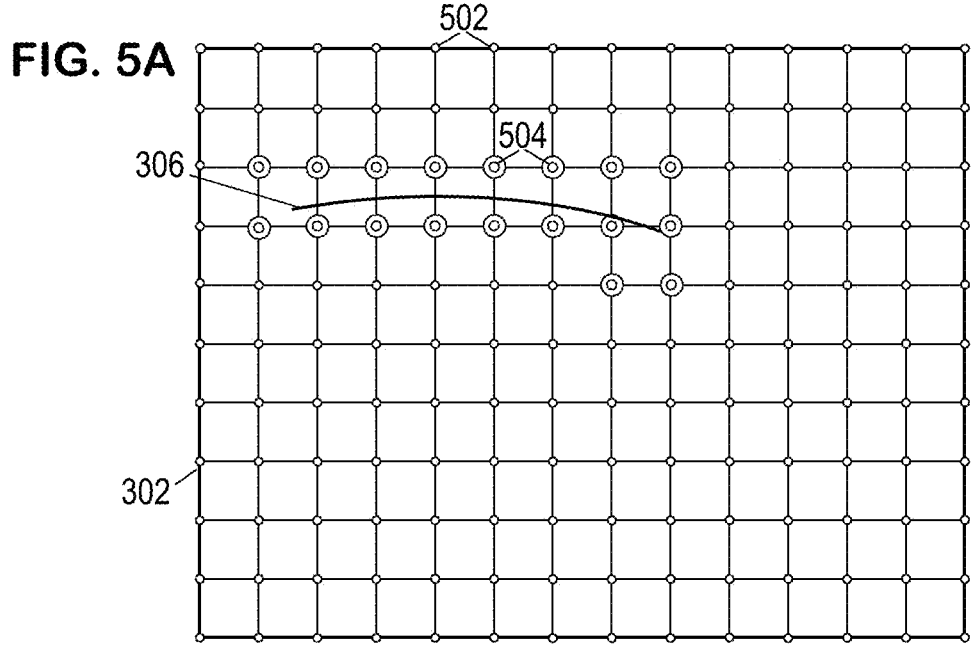
FIGS. 5A and 5B are plan views of the illustrative horizon including a grid of level set function (LSF) nodes for representing the surface.
Figure 5B:
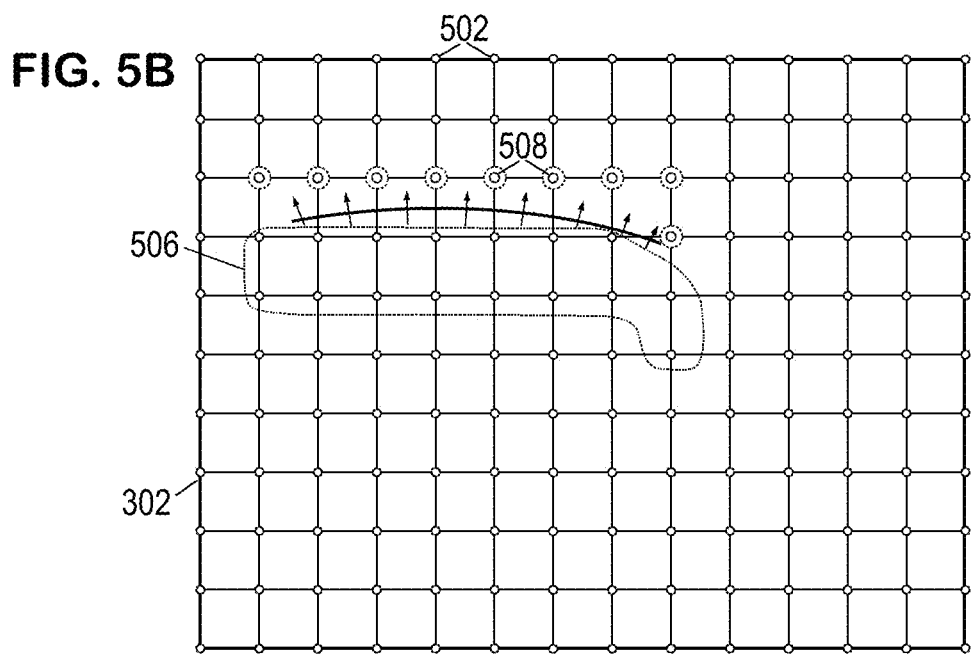

In the second approach, the LSF method is applied to the distance measures at vertices of a regular mesh for all the cells intersected by the horizon. FIG. 5A is a plane view of the illustrative horizon 302 including a grid of mesh vertices 502 above the horizon. Each vertex 502 has an associated $d_i$ distance value to the horizon, which may be, e.g., a Euclidean distance or a vertical (z-axis) distance between the vertex and the surface, or simply a radial basis function. The vertices 504 for the mesh cells containing the fault 306 may have two associated distance values (one for each side of the fault) as indicated by the double circles. That is, these vertices 504 (like the remaining vertices 502) have an associated di distance value for the surface immediately below or above them, but also have an extrapolated di distance value for an extrapolation of the surface on the other side of the fault. FIG. 5B illustrates an extrapolation process in which the associated distance values for a set of vertices 506 on one side of the fault 306 is used to extrapolate distance values across the fault to the set of vertices 508. The extrapolated di distance values for the remaining vertices 504 (FIG. 5A) are similarly obtained by extrapolating in the other direction across the fault. Though only the vertices above the horizon are shown in this plan view, the process is the same for mesh vertices below the horizon.

For the mesh cells including the partial fault, then, the LSF method determines two surface representations. A first surface representation is derived using the associated distance values on a first side of the fault in combination with the extrapolated distance values on the opposite side of the fault. The second surface representation is derived using the associated distance values on the second side of the fault in combination with the extrapolated distance values on the first side of the fault. The partial fault is then used as a boundary surface to clip each of the horizon surfaces at the appropriate location. Because the surface representations have some degree of independence from each other, this approach enables representation of a discontinuity across the fault.

In the third approach, the partial fault 306 is fictitiously extended to divide the horizon 302 into two pieces. FIG. 6A shows a plan view of the horizon 302 with linear (planar) extensions 602, 604, for the partial fault 306. With the extensions, the fault divides the mesh into two sets of vertices 606 (shown as filled in nodes) and 608 (shown as open nodes). The LSF method is applied independently to each set of vertices to determine a separate representation for each piece of the horizon. To merge the two separate surface representations, the LSF method is applied to the boundary mesh cells not containing the partial fault 306, i.e., the mesh cells 612, 614 traversed by fictitious extensions 602, 604. These cells are cross-hatched in FIG. 6B. The LSF determines a representation of the horizon surface within these cells based on the associated di distance values at the vertices of these cells. Continuity is assured because these vertices and their di distance values are also shared in common with the surface representations for the separate parts of the horizon.

Figure 7:
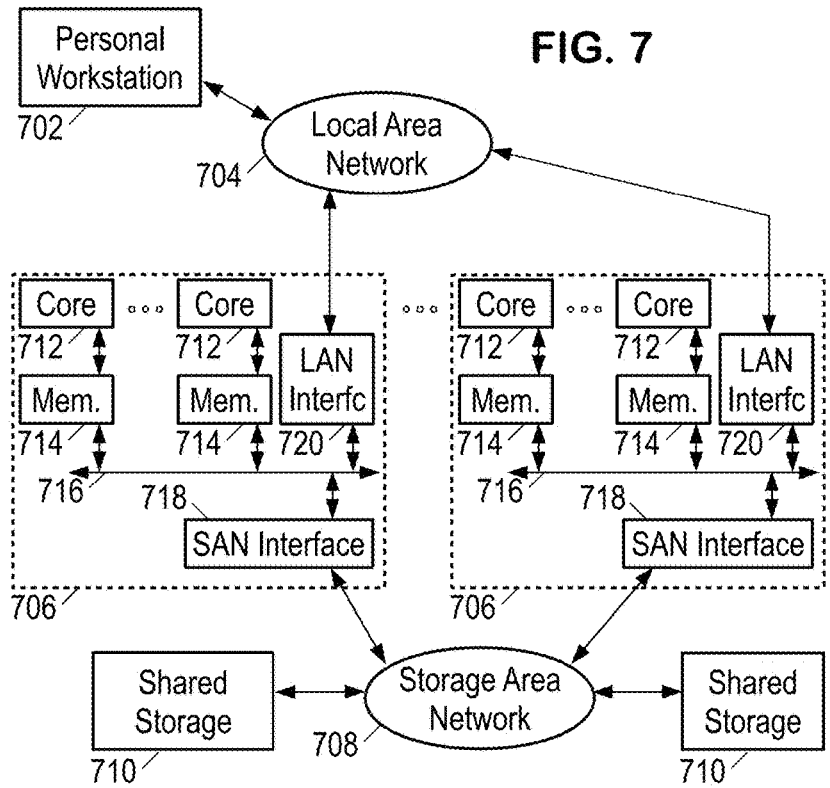
FIG. 7 is a block diagram of an illustrative subsurface modeling system.

To flesh out the certain additional details of the foregoing approaches, we now turn to FIG. 7, which is a block diagram of an illustrative subsurface modeling system. The illustrative subsurface modeling system includes a personal workstation 702 coupled via a local area network (LAN) 704 to one or more multi-processor computers 706, which are in turn coupled via a storage area network (SAN) 708 to one or more shared storage units 710. Personal workstation 702 serves as a user interface to the subsurface modeling system, enabling a user to load data into the system, to configure and monitor the operation of the system, and to retrieve the results (often in the form of image data) from the system. Personal workstation 702 may take the form of a desktop computer with a display that graphically shows representations of the input and result data, and with a keyboard that enables the user to move files and execute processing software. LAN 704 provides high-speed communication between multi-processor computers 706 and with personal workstation 702. The LAN 704 may take the form of an Ethernet network.

Multi-processor computer(s) 706 provide parallel processing capability to enable suitably prompt processing of the input data to derive the results data. Each computer 706 includes multiple processors 712, distributed memory 714, an internal bus 716, a SAN interface 718, and a LAN interface 720. Each processor 712 operates on allocated tasks to solve a portion of the overall problem and contribute to at least a portion of the overall results. Associated with each processor 712 is a distributed memory module 714 that stores application software and a working data set for the processors' use. Internal bus 716 provides inter-processor communication and communication to the SAN or LAN networks via the corresponding interfaces 718, 720. Communication between processors in different computers 706 can be provided by LAN 704.

SAN 708 provides high-speed access to shared storage devices 710. The SAN 708 may take the form of, e.g., a Fibrechannel or Infiniband network. Shared storage units 710 may be large, stand-alone information storage units that employ magnetic disk media for nonvolatile data storage. To improve data access speed and reliability, the shared storage units 710 may be configured as a redundant disk array ("RAID").

The processors 712 cooperatively execute subsurface modeling software stored in the distributed memory and/or on the shared storage units, which configures to processors to retrieve measurement data and stored model information from the shared storage units 710, operate on the retrieved data and information to implement the modeling methods and improvements disclosed herein, and to store the resulting subsurface models on the shared storage units 710 for future use. Such future use includes visualization methods to convey model information to users, simulation of reservoir fluid movements, and evaluation of well placement and production strategies, enabling users to select sites for drillers to direct boreholes, complete wells, and produce reservoir fluids in an efficient manner.

Figure 8:
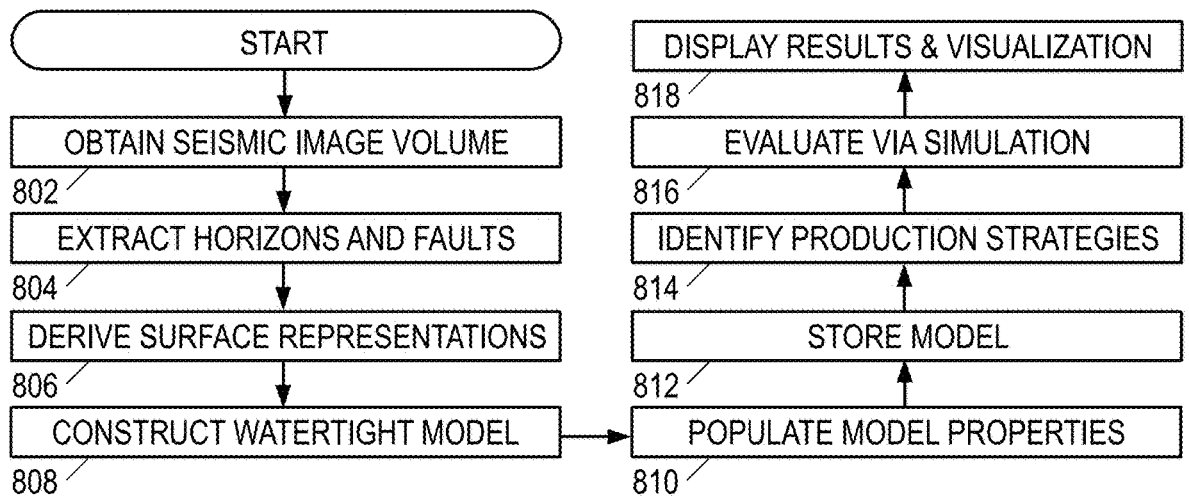
FIG. 8 is a flow diagram of an illustrative subsurface modeling method.

FIG. 8 is a flow diagram of an illustrative subsurface modeling method. It begins in block 802 with the system obtaining a seismic image volume. In block 804 the system automatically (or in response to user guidance) processes the image volume to extract horizons and faults. For the purposes of the present disclosure, at least one of the horizons is intersected by a partial fault. In block 806, the system derives a function-based representation for each of the surfaces. For the horizon intersected by a partial fault, the system employs one or more of the three approaches described above. In block 808, the system employs the function-based representations to construct a watertight subsurface model. The petrophysical parameter values are assigned by the system in block 810, and in block 812 the system stores the watertight subsurface model on non-transitory information storage devices. The watertight subsurface model may also, optionally, be displayed or outputted and may further offer an interactive visualization of the watertight subsurface model to a user. In block 814, the system configures the watertight subsurface model in accordance with an identified production strategy, e.g., by specifying well locations and completion zones. In block 816 the system simulates production from the reservoir to evaluate the identified strategy. Blocks 814 and 816 may be repeated as needed to evaluate different strategies and refinements thereof. In block 818 the system displays the simulation results and may further offer an interactive visualization of the simulation and model to a user.

In the first approach to deriving the subsurface representations, the system employs a radial basis function method in which a weighted sum of radial basis functions is fitted to nodes on the horizon, subject to elimination of direct interaction between nodes on opposite sides of the partial fault. The elimination may be provided by adjusting matrix entries in a linear least squares equation to solve for weight coefficients, said adjusting producing an effect of a substantially increased distance value between nodes on opposite sides of the partial fault.

In the second approach to deriving the subsurface representations, the system employs mesh vertices on or around the horizon having associated distance values to the horizon, the vertices including a set of mesh vertices that define mesh cells traversed by the partial fault. The set of mesh vertices for the traversed cells are assigned extrapolated distance values that are extrapolated across the partial fault from associated distance values for vertices on an opposite side of the partial fault. The system applies a level set function method in which a function may be fit to, or function values extrapolated from, said associated and extrapolated distance values. The associated and extrapolated distance values are signed based on which side of the horizon their vertices are on.

In the third approach to deriving the subsurface representations, the system creates one or more extensions of the partial fault to divide the horizon into two separate pieces. The system determines for each of multiple mesh vertices on or around the horizon an associated distance value to the horizon. Using the associated distance values, the system applies a level set function method to fit a first function to a first of the two separate pieces, a second function to a second of the two separate pieces, and a merge function to a set of mesh vertices that define mesh cells traversed by said one or more extensions.

Though the operations shown and described in the flow diagram are treated as being sequential for explanatory purposes, in practice the method may be carried out by multiple processors operating concurrently and perhaps even speculatively to enable out-of-order operations. The ordering and sequential treatment is not meant to be limiting. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A subsurface modeling method that comprises:
    obtaining a seismic image volume;
    identifying a horizon within the seismic image volume, said horizon being intersected by a partial fault;
    deriving a function-based representation of the horizon, the representation being continuous except across the partial fault, wherein said deriving employs a radial basis function method in which a weighted sum of radial basis functions is fitted to nodes on the horizon, subject to elimination of direct interaction between nodes on opposite sides of the partial fault and wherein said elimination is provided by (i) adjusting matrix entries in an equation to solve for weight coefficients, said adjusting producing an effect of a substantially increased distance value between nodes on opposite sides of the partial fault or (ii) adjusting matrix entries in an equation to solve for weight coefficients, said adjusting producing an effect of a substantially increased distance value between nodes on opposite sides of the partial fault;

constructing a watertight subsurface model using the function-based representation; and assigning petrophysical parameter values to compartments of the watertight subsurface model.

2. The method of claim 1, further comprising at least one of:
storing the watertight subsurface model;
using the stored watertight subsurface model to provide an interactive visualization of subsurface structures in a region corresponding to the seismic image volume;
simulating movement of reservoir fluids in said, region; and
providing an evaluation of one or more reservoir production strategies including well placements.

3. The method of claim 1, wherein said elimination is provided by adjusting matrix entries in an equation to solve for weight coefficients, said adjusting producing an effect of a substantially increased distance value between nodes on opposite sides of the partial fault.

4. The method of claim 1, wherein said elimination is provided by zeroing radial basis function contributions between nodes on opposite sides of the partial fault in a matrix equation.

5. A subsurface modeling system that comprises;
a memory having subsurface modeling software; and
one or more processors coupled to the memory to execute the subsurface modeling software, the software causing the one or more processors to perform operations including the steps of the method of claim 1.

6. A non-transitory, machine-readable medium comprising code executable by a computer to implement the method of claim 1.

7. A subsurface modeling method that comprises;
obtaining a seismic image volume;
identifying a horizon within the seismic image volume, said horizon being intersected by a partial fault;
deriving a function-based representation of the horizon, the representation being continuous except across the partial fault, wherein said deriving employs mesh vertices on or around the horizon having associated signed distance values to the horizon, said mesh vertices including a set of mesh vertices that, define mesh cells traversed by the partial fault, the set of mesh vertices further having extrapolated distance values that are extrapolated across the partial fault from associated distance values for vertices on an opposite side of the partial fault, and wherein said deriving applies a level set function method in which function values are interpolated from said associated and extrapolated distance values;
constructing a watertight subsurface model using the function-based representation; and
assigning petrophysical parameter values to compartments of the watertight subsurface model.

8. The method of claim 7, wherein the associated and extrapolated distance values are signed based on which side of the horizon their vertices are on.

9. The method of claim 7, wherein said constructing includes closing any horizon mismatch extending beyond the partial fault.

10. The method of claim 7, further comprising at least one of:
storing the watertight subsurface model;
using the stored watertight subsurface model to provide an interactive visualization of subsurface structures in a region corresponding to the seismic image volume;
simulating movement of reservoir fluids in said region; and
providing an evaluation of one or more reservoir production strategies including well placements.

11. A subsurface modeling system that comprises:
a memory having subsurface modeling software; and
one or more processors coupled to the memory to execute the subsurface modeling software, the software causing the one or more processors to perform operations including the steps of the method of claim 7.

12. A non-transitory, machine-readable medium comprising code executable by a computer to implement the method of claim 7.

13. A subsurface modeling method that comprises:
obtaining a seismic image volume;
identifying a horizon within the seismic image volume, said horizon being intersected by a partial fault;
deriving a function-based representation of the horizon, the representation being continuous except across the partial fault, wherein said deriving includes:
creating one or more extensions of the partial fault to divide the horizon into two separate pieces;
determining for each of multiple mesh vertices on or around the horizon an associated distance value to the horizon; and
applying a level set function method to fit a first function to a first of the two separate pieces, a second function to a second of the two separate pieces, and a merge function to a set of mesh vertices that define mesh cells traversed by said one or more extensions;
constructing a watertight subsurface model using the function-based representation; and
assigning petrophysical parameter values to compartments of the watertight subsurface model.

14. The method of claim 13, further comprising at least one of:
storing the watertight subsurface model;
using the stored watertight subsurface model to provide an interactive visualization of subsurface structures in a region corresponding to the seismic image volume;
simulating movement of reservoir fluids in said region; and
providing an evaluation of one or more reservoir production strategies including well placements.

15. A subsurface modeling system that comprises:
a memory having subsurface modeling software; and
one or more processors coupled to the memory to execute the subsurface modeling software, the software causing the one or more processors to preform operations including the steps of the method of claim 13.

16. A non-transitory, machine-readable medium comprising code executable by a computer to implement the method of claim 13.

* * * * *